US012768041B2

United States Patent
(12) United States Patent
Bajaj et al.

(10) Patent No.: US 12,768,041 B2
(45) Date of Patent: Oct. 20, 2026

(54) METHODS FOR FORMING IMPURITY FREE METAL ALLOY FILMS

(71) Applicant: Applied Materials, Inc., Santa Clara, CA (US)

(72) Inventors: Geetika Bajaj, Cupertino, CA (US); Darshan Thakare, Palghar (IN); Prerna Goradia, Mumbai (IN); Robert Jan Visser, Menlo Park, CA (US); Yixiong Yang, Fremont, CA (US); Jacqueline S. Wrench, San Jose, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/642,134

(22) Filed: Apr. 22, 2024

(65) Prior Publication Data

US 2024/0287678 A1 Aug. 29, 2024

Related U.S. Application Data

(60) Continuation of application No. 17/735,257, filed on May 3, 2022, now abandoned, which is a division of (Continued)

(51) Int. Cl.

*C23C 16/455* (2006.01)
*C08G 77/26* (2006.01)

(Continued)

(52) U.S. Cl.

CPC ........ *C23C 16/45553* (2013.01); *C08G 77/26* (2013.01); *C08G 77/50* (2013.01);

(Continued)

(58) Field of Classification Search

CPC . C23C 16/45553; C23C 16/466; C23C 16/34; C23C 16/45502; C23C 16/32; C08G 77/50; C08G 77/26; H01L 21/28088

See application file for complete search history.

(56) References Cited

U.S. PATENT DOCUMENTS 9,157,149 B2 10/2015 Winter et al.
9,249,505 B2 2/2016 Winter et al.

(Continued)

FOREIGN PATENT DOCUMENTS

TW 201715590 A 5/2017
WO 2008027215 A2 3/2008

(Continued)

OTHER PUBLICATIONS

16991430 Structure Search (Year: 2021).

(Continued)

*Primary Examiner* — Michael G Miller
(74) *Attorney, Agent, or Firm* — Servilla Whitney LLC

(57) ABSTRACT

Methods of depositing a metal film by exposing a substrate surface to a halide precursor and an organosilane reactant are described. The halide precursor comprises a compound of general formula (I): $MQ_zR_m$, wherein M is a metal, Q is a halogen selected from Cl, Br, F or I, z is from 1 to 6, R is (Continued)

selected from alkyl, CO, and cyclopentadienyl, and m is from 0 to 6. The aluminum reactant comprises a compound of general formula (II) or general formula (III):

(II)

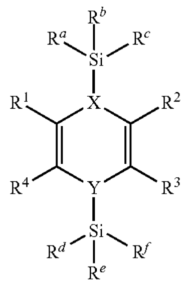

(III)

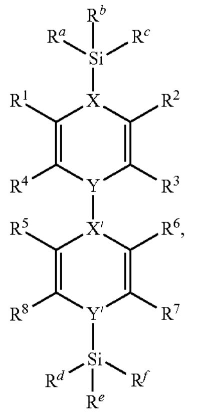

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C).

17 Claims, 2 Drawing Sheets

Related U.S. Application Data application No. 16/991,430, filed on Aug. 12, 2020, now Pat. No. 11,359,282.

(51) Int. Cl.

| | |
|---|---|
| ***C08G 77/50*** | (2006.01) |
| ***C23C 16/32*** | (2006.01) |
| ***C23C 16/34*** | (2006.01) |
| ***C23C 16/46*** | (2006.01) |
| ***H10D 64/01*** | (2025.01) |

(52) U.S. Cl.

CPC .............. *C23C 16/32* (2013.01); *C23C 16/34* (2013.01); *C23C 16/45502* (2013.01); *C23C 16/466* (2013.01); *H10D 64/01318* (2026.01)

(56) References Cited

U.S. PATENT DOCUMENTS

| | | | | |
|---|---|---|---|---|
| 10,036,089 | B2 | 7/2018 | Thompson et al. | |
| 10,533,023 | B2 | 1/2020 | Winter et al. | |
| 10,711,346 | B2 | 7/2020 | Winter | |
| 2005/0181555 | A1 | 8/2005 | Haukka et al. | |
| 2015/0104575 | A1 * | 4/2015 | Takoudis | C23C 16/406 427/255.35 |
| 2015/0279680 | A1 | 10/2015 | Kashefi et al. | |
| 2016/0322229 | A1 | 11/2016 | Ganguli et al. | |
| 2018/0230592 | A1 | 8/2018 | Winter et al. | |
| 2018/0261678 | A1 | 9/2018 | Lee et al. | |
| 2022/0049353 | A1 | 2/2022 | Bajaj et al. | |
| 2024/0279800 | A1 | 8/2024 | Hatanpaa et al. | |

FOREIGN PATENT DOCUMENTS

| | | | | |
|---|---|---|---|---|
| WO | WO-2014210512 | A1 * | 4/2015 | C01B 33/021 |
| WO | 2018234567 | A1 | 12/2018 | |
| WO | 2021226170 | A1 | 11/2021 | |

OTHER PUBLICATIONS

Chemical Structures (Year: 2021).

PCT International Search Report and Written Opinion in PCT/US2021/045481 dated Dec. 2, 2021, 12 pages.

Klesko, Joseph P., et al., "Thermal Atomic Layer Deposition of Titanium Films Using Titanium Tetrachloride and 2-Methyl-1,4-bis(trimethylsilyl)-2,5-cyclohexadiene or 1,4-Bis(trimethylsilyl)-1,4-dihydropyrazine", Chem. Mater. 2015, 27, 4918-4921, Jul. 15, 2015.

Stevens, E. C., et al., "Thermal atomic layer deposition of Sn metal using SnCl4 and a vapor phase sily dihydropyrazine reducing agent", Journal of Vacuum Science & Technology, A: Vacuum, Surfaces, and Films, 2018, vol. 36, No. 6, pp. 06A106-1-06A106-10.

PCT International Search Report and Written Opinion in PCT/US2024/026980 dated Aug. 30, 2024, 26 pages.

* cited by examiner

METHODS FOR FORMING IMPURITY FREE METAL ALLOY FILMS

CROSS-REFERENCE TO RELATED APPLICATIONS

This application is a Continuation of U.S. application Ser. No. 17/735,527, filed May 3, 2022, which is a Divisional application of U.S. application Ser. No. 16/991,430, filed on Aug. 12, 2020, granted as U.S. Pat. No. 11,359,282 on Jun. 14, 2022, the entire disclosures of which are hereby incorporated by reference.

TECHNICAL FIELD

The invention generally relates to methods for atomic layer deposition (ALD) of metal films. In particular, embodiments of the invention are directed to thermal-only based ALD deposition.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. It is believed that the hGAA structure provides good electrostatic control and can find broad adoption in complementary metal oxide semiconductor (CMOS) wafer manufacturing.

Work function metal is of great interest in metal oxide semi-conductor (MOS) transistor applications. Metal films such as tantalum carbide (TaC), titanium carbide (TiC), titanium aluminum carbide (TiAlC), and titanium aluminum (TiAl) have been evaluated as candidates for n-metals (work function metals) in MOS transistors.

Typically, the effective work function (WF) of metals and their alloys is governed by the effective electronegativity. More electropositive metals demonstrate n-type metal oxide semiconductor (N-MOS) work function. The most widely used N-metal films include titanium (Ti), aluminum (Al), hafnium (Hf), and lanthanum (La). There are no viable options to deposit these pure metal films without plasma. Plasma processes are typically undesirable for transistor manufacturing as plasma can cause detrimental effects on the previously deposited films and the resulting device. Therefore, there is a need in the art for methods to deposit these films with minimal electronegative residues.

SUMMARY

One or more embodiments of the disclosure are directed to a method of depositing a film. In one or more embodiments, the method comprises: exposing at least a portion of a substrate surface to a halide precursor comprising a compound having the general formula (I) $MQ_zR_m$ (I), wherein M is a metal, Q is a halogen selected from Cl, Br, F or I, z is from 1 to 6, R is selected from alkyl, CO, cyclopentadienyl, amidinate, diazadiene, or amidate, and m is from 0 to 6; and exposing at least a portion of the substrate surface to an organosilane reactant comprising a compound of general formula (II) or general formula (III)

(II)

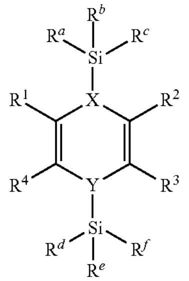

(III)

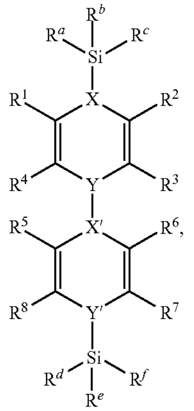

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C), to deposit a metal film on the substrate surface, the metal film substantially free of carbon.

Additional embodiments of the disclosure are directed to an electronic device. In one or more embodiment, a gate stack comprises: a high-x dielectric layer on a substrate; a first titanium nitride layer on the high-x dielectric layer; a work-function layer on the first titanium nitride layer; and a second titanium nitride layer on the work-function layer, wherein the work-function layer comprises a metal film substantially free of carbon.

Further embodiments of the disclosure are directed to a non-transitory computer readable medium including instructions, that, when executed by a controller of a processing chamber, causes the processing chamber to perform operations of: flow a halide precursor into a processing volume of the processing chamber having a substrate, the halide precursor having general Formula (I) $MQ_zR_m$ (I), wherein M is a metal, Q is a halogen selected from Cl, Br, F or I, z is from 1 to 6, R is selected from alkyl, CO, cyclopentadienyl, amidinate, diazadiene, or amidate, and m is from 0 to 6, purge the processing chamber of the halide precursor; expose the substrate to a organosilane precursor of general Formula (II) or general Formula (III):

(II)

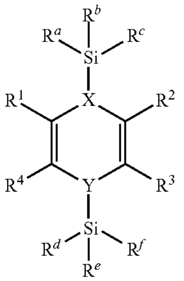

(III)

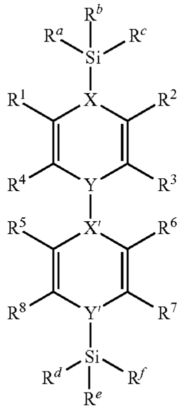

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C); and purge the processing chamber of the organosilane precursor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
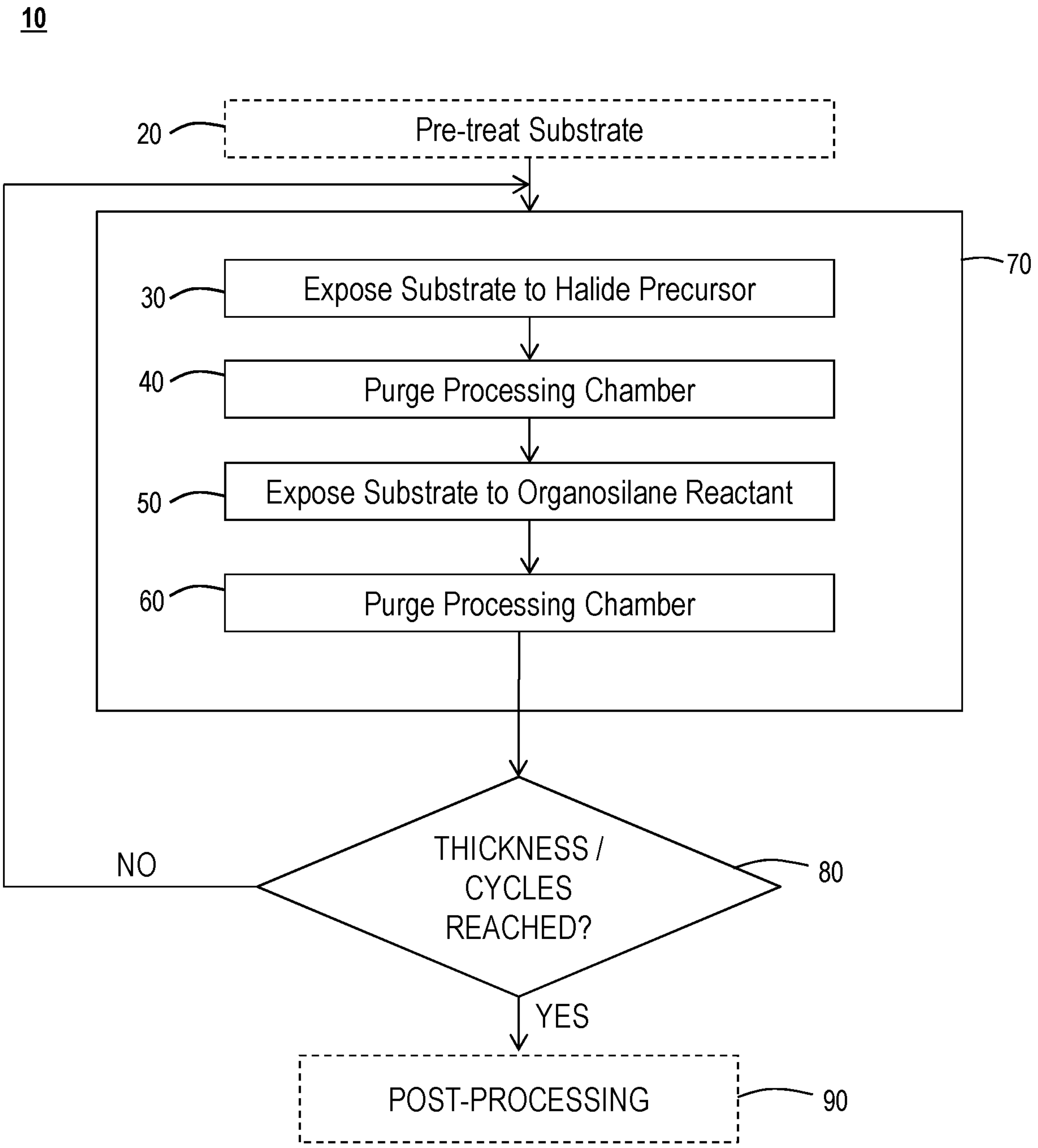
FIG. 1 illustrates a process flow diagram of a method according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "reactive gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

In one or more embodiments, methods for thermal-only based atomic layer deposition (ALD) deposition of metal films particularly one or more of titanium and/or aluminum, are described. Some embodiments advantageously provide methods for forming stable compositions with greater than 95% step coverage. Some embodiments of the method advantageously provide work function metals for gate-all-around (GAA) architectures.

Typically, alloys of two electropositive elements are deposited using a halide metal for the first element and a metal-organic based precursor for the second element. An oxidation-reduction reaction between the precursors deposits an alloy film. However, the oxidation-reduction reaction forms carbon residues, which can reduce the ability of the film to exhibit the best effective work function. One or more embodiments advantageously provides an alloy film that is substantially free of impurities, e.g. carbon, with a controlled composition.

Titanium (Ti) and aluminum (Al) are both electropositive metals and are very difficult to reduce. Some embodiments of the disclosure provide thermal vapor phase deposition of pure metal films. Some embodiments advantageously permit compositional control of the alloy films by controlling the reactants.

In one or more embodiments, thermal atomic layer deposition (ALD) methods are provided that involve the reduction of a metal halide precursor with an organosilane reducing agent.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one or more embodiments, the purge gas is selected from one or more of argon (Ar), nitrogen ($N_2$), or helium (He). In one or more embodiments, the same purge gas is used to purge the precursor and the reductant. In other embodiments, a different purge gas is used to purge the processing chamber of the precursor than the purge gas used to purge the processing chamber of the oxidant.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In one or more embodiments, the films described herein may be formed by atomic layer deposition (ALD) processes using a metal halide precursor and an organosilane reducing agent. The atomic layer deposition process of one or more embodiments is a thermal process and does not involve the use of a plasma.

As used herein "metal film" refers to a film that comprises a metal. In one or more embodiments, the metal film is substantially free impurities. In one or more embodiments, the metal film is substantially free of carbon (C) despite the substrate being exposed to a carbon-containing organosilane precursor/reductant. As used herein, the term "substantially free" means that there is less than about 5%, including less than about 4%, less than about 3%, less than about 2%, less than about 1%, and less than about 0.5% of carbon, on an atomic basis, in the metal film.

In one or more embodiments, the metal film contains greater than about 90% total metal content on an atomic basis, including greater than about 95% total metal, greater than about 96% total metal, greater than about 97% total metal, greater than about 98% total metal, or greater than about 99% total metal. As used herein, the term "total metal content" refers to the percentage of metal, on an atomic basis, present in the metal film. In one or more embodiments, the metal may come from the halide precursor.

In one or more embodiments, the metal halide precursor comprises a compound having the general Formula (I): $MQ_zR_m$ (I), wherein M is a metal, Q is a halogen selected from Cl, Br, F or I, z is from 1 to 6, R is selected from alkyl, CO, cyclopentadienyl, amidinate, diazadiene, or amidate, and m is from 0 to 6.

In one or more embodiments, the metal, M, is selected from one or more metal from group III, group IV, group V, group VI, or group VII of the periodic table, or Sn or Si. In other embodiments, the metal, M, is selected from one or more of scandium (Sc), yttrium (Y), lanthanum (La), actinium (Ac), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), technetium (Tc), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd), mercury (Hg), tin (Sn), or (silicon) Si. In one or more embodiments, the metal M is selected from one or more of Ti, Ta, Zr, La, Hf, Ce, Zn, Cr, Sn, W, or V. In one or more specific embodiments, the metal M is selected from one or more of titanium (Ti) and aluminum (Al).

In one or more embodiments, Q is a halogen selected from Cl, Br, F, or I. In one or more embodiments, z is from 1 to 6, including 1, 2, 3, 4, 5, or 6. In other embodiments, Q is selected from Cl or Br. In a specific embodiment, Q is Cl. In another specific embodiment, Q is Br.

Unless otherwise indicated, as used herein, "alkyl," or "alk" includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. In one or more embodiments, R is selected from alkyl, CO, cyclopentadienyl, amidinate, diazadiene, or amidate. In one or more embodiments, R is $C_{1-6}$ alkyl. In one or more embodiments, m is from 0 to 6, including 0, 1, 2, 3, 4, 5, or 6.

In one or more embodiments, the organosilane reducing agent has a structure of Formula II or Formula III:

(II)

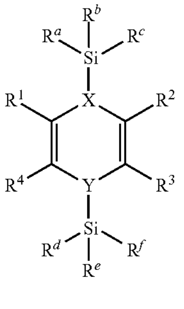

-continued (III)

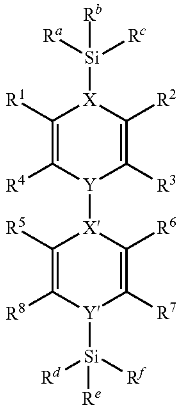

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C).

The term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted. In specific embodiments, at least one of $R^a$, $R^b$, $R^c$, $R^d$, $R^e$, and $R^f$ comprise methyl. In some embodiments, each of $R^a$, $R^b$, $R^c$, $R^d$, $R^e$, and $R^f$ comprise methyl.

In one or more embodiments, the organosilane reducing agents are selected from bis(trimethylsilyl)cyclohexadiene, bis(trimethylsilyl)diaza-cyclohexadiene, bis(trimethylsilyl)-aza-cyclohexadiene, bis(trimethylsilyl)-dihydro-bipyridine, 3,6-bis(trimethylsilyl)-1,4-cyclohexadiene, 1-methyl-3,6-bis(trimethylsilyl)-1,4-cyclohexadiene, and 1,4-bis-(trimethylsilyl)-1,4-diaza-2,5-cyclohexadiene.

With reference to FIG. 1, one or more embodiments of the disclosure are directed to method 10 of depositing a thin film. The method illustrated in FIG. 1 is representative of a thermal atomic layer deposition (ALD) process in which the substrate or substrate surface is exposed sequentially to the reactive gases in a manner that prevents or minimizes gas phase reactions of the reactive gases.

In some embodiments, the method 10 includes an optional pre-treatment operation 20. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In one or more embodiments, an adhesion layer, such as titanium nitride, is deposited at pre-treatment operation 20.

With reference to FIG. 1, the method 10 comprises a deposition cycle 70. At deposition operation 30, a process is performed to deposit a metal-containing film on the substrate (or substrate surface). At operation 30, the substrate (or substrate surface) is exposed to a halide precursor comprising a compound having the general Formula (I): $MQ_zR_m$ (I), wherein M is a metal, Q is a halogen selected from Cl, Br, F or I, z is from 1 to 6, R is selected from alkyl, CO, cyclopentadienyl, amidinate, diazadiene, or amidate, and m is from 0 to 6. In one or more specific embodiments, the halide precursor comprises titanium tetrachloride ($TiCl_4$) to form a titanium species on the substrate surface. In other embodiments, the halide precursor comprises aluminum chloride ($AlCl_3$) to form an aluminum species on the substrate surface.

In one or more embodiments, the halide precursor-containing process gas may be provided in one or more pulses or continuously. The flow rate of the halide precursor-containing process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The halide precursor of Formula I can be provided at any suitable pressure including, but not limited to, a pressure in the range of about 5 mTorr to about 40 Torr, or in the range of about 100 mTorr to about 40 Torr, or in the range of about 5 Torr to about 40 Torr, or in the range of about 50 mTorr to about 2000 mTorr, or in the range of about 100 mTorr to about 1000 mTorr, or in the range of about 200 mTorr to about 500 mTorr.

In one or more embodiments, the period of time that the substrate is exposed to the halide precursor-containing process gas may be any suitable amount of time necessary to allow the precursor to form an adequate nucleation layer atop the conductive substrate surfaces. For example, the process gas may be flowed into the process chamber for a period of about 0.1 seconds to about 90 seconds. In some time-domain ALD processes, the substrate surface is exposed to the halide precursor-containing process gas for a time in the range of from about 0.1 sec to about 90 sec, or in the range of from about 0.5 sec to about 60 sec, or in the range of from about 1 sec to about 30 sec, or in the range of from about 2 sec to about 25 sec, or in the range of from about 3 sec to about 20 sec, or in the range of from about 4 sec to about 15 sec, or in the range of from about 5 sec to about 10 sec.

In some embodiments, an inert carrier gas may additionally be provided to the process chamber at the same time as the halide precursor-containing process gas. The carrier gas may be mixed with the halide precursor-containing process gas (e.g., as a diluent gas) or separately and can be pulsed or of a constant flow. In some embodiments, the carrier gas is flowed into the processing chamber at a constant flow in the range of from about 1 to about 10000 sccm. The carrier gas may be any inert gas, for example, such as argon (Ar), nitrogen (N), helium (He), neon (Ne), combinations thereof, or the like. In one or more specific embodiments, the halide precursor-containing process gas is mixed with argon prior to flowing into the process chamber.

In one or more embodiments, the temperature of the substrate during deposition can be controlled, for example, by setting the temperature of the substrate support. In some embodiments the substrate is held at a temperature in a range of from about 100° C. to about 500° C., including a temperature of about 100° C., about 150° C., about 200° C., about 250°, about 300° C., about 350° C., about 400° C., about 450° C., and about 500° C.

In one or more embodiments, at operation 40, the processing chamber is then purged of the halide precursor. Purging can be accomplished with any suitable gas that is not reactive with the substrate, film on the substrate, and/or processing chamber walls. Suitable purge gases include, but are not limited to, nitrogen ($N_2$), helium (He), and argon (Ar). The purge gas may be used to purge the processing chamber of the halide precursor, and/or the organosilane reactant. In some embodiments, the same purge gas is used for each purging operation. In other embodiments, a different purge gas is used for the various purging operations.

In one or more embodiments, at operation 50, at least a portion of the substrate surface is exposed to an organosilane reactant to deposit a metal film. The organosilane reactant comprising a compound of general formula (II) or general formula (III)

(II)

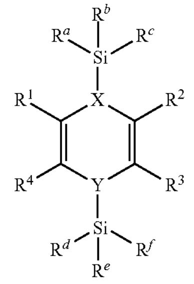

(III)

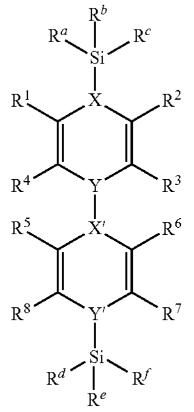

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C).

In one or more specific embodiments, the organosilane precursor reacts with the metal species on the substrate surface to form a metal film. For example, in embodiments where the halide precursor comprises titanium tetrachloride ($TiCl_4$), the organosilane precursor reduces the titanium species and forms a titanium film.

In one or more embodiments, at operation 60, the processing chamber is then purged of the organosilane reactant. In one or more embodiments, the metal film is deposited on the substrate surface. In one or more embodiments, the metal film is substantially free of carbon.

At decision 80, the thickness of the deposited film, or number of cycles of halide precursor and organosilane precursor is considered. If the deposited film has reached a predetermined thickness or a predetermined number of process cycles have been performed, the method 10 moves to a post-processing operation 90. If the thickness of the deposited film or the number of process cycles has not reached the predetermined threshold, the method 10 returns to deposition operation 70 to expose the substrate surface to the halide precursor again in operation 30, and continuing.

In one or more embodiments, the deposition cycle 70 is repeated. At operation 30, the halide precursor of Formula I comprises a different precursor that in the first deposition cycle. For example, in one or more embodiments, the halide precursor comprises aluminum chloride ($AlCl_3$) to form an aluminum species, which is then subsequently reduced by the organosilane precursor. In some embodiments, the precursors may not change every other cycle. In some embodiments, for example, there may be five cycles with one precursor and then three cycles with the other precursor.

The optional post-processing operation 90 can be, for example, a process to modify film properties (e.g., annealing or densification) or a further film deposition process (e.g., additional ALD or CVD processes) to grow additional films. In some embodiments, the post-processing operation 90 can be a process that modifies a property of the deposited film. In some embodiments, the post-processing operation 90 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

In one or more embodiments, the method 10 can be performed at any suitable temperature depending on, for example, the halide precursor, organosilane reducing agent, or thermal budget of the device. In some embodiments, exposures to the halide precursor (operation 30) and the organosilane reducing agent (operation 50) occur at the same temperature. In some embodiments, the substrate is maintained at a temperature in a range of about 200° C. to about 500° C., or in the range of about 350° C. to about 500° C.

In one or more embodiments, the metal film, titanium aluminum (TiAl) film has a carbon content of less than or equal to about 5% on an atomic basis.

In one or more embodiments, the metal film, which comprises less than or equal to about 5% carbon on an atomic basis, may be subjected to further processing to form a metal carbide film. In such embodiments, the metal portion of the carbide film, e.g. titanium aluminum (TiAl), contains less than about 5% carbon impurity.

In one or more embodiments, the method is used to deposit pure thermal titanium (Ti) metal and (aluminum) Al metal which can be processed further to yield a TiAl film. The deposited film may have certain degree of C incorporation and can form TiAlC.

Figure 2:
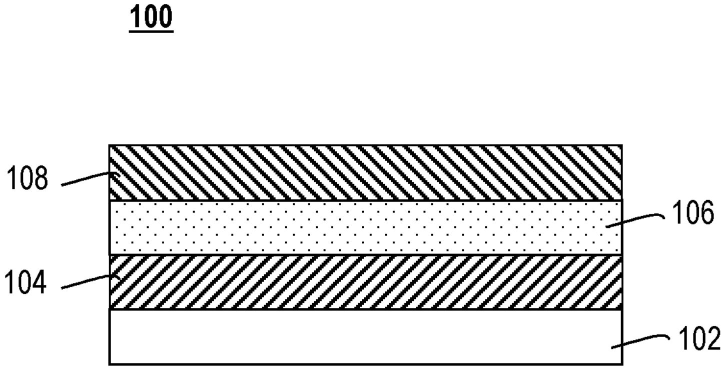
FIG. 2 illustrates a cross-section view of a metal oxide stack according to embodiments described herein.

One or more embodiments of the disclosure are directed to a metal oxide stack that is part of a gate stack in a metal oxide semiconductor (MOS). Referring to FIG. 2, the metal oxide stack 100 comprises a high-x dielectric layer 104 on a substrate 102, and a titanium nitride layer 106 on the high-x dielectric layer 104. The embodiment illustrated in FIG. 2 has a separate high-K dielectric layer 104 on a substrate 102. However, the skilled artisan will recognize that the high-x dielectric layer 104 can be the substrate 102 or a portion of the substrate 102. For example, the high-x dielectric 104 can be formed on the substrate 102 to form the metal oxide stack 100.

In one or more embodiments, the metal oxide stack 100 is formed on substrate 102 which can be any suitable material or shape. In the embodiment illustrated, the substrate 102 is a flat surface and the metal oxide stack 100 is represented by rectangular boxes placed on top of one another. However, those skilled in the art will understand that the substrate 102 can have one or more features (i.e., trenches or vias) and that the metal oxide stack 100 can be formed to conform to the shape of the substrate 102 surface.

In one or more embodiments, a work function layer 108 is formed on the titanium nitride layer 106. In one or more embodiments, the work function layer 108 comprises a metal film that is substantially free of carbon, having less than about 5% carbon on an atomic basis. The metal film is prepared by the methods of one or more embodiments. The metal film can be formed by exposing at least a portion of the substrate 102 to a halide precursor comprising a compound having the general Formula (I): $MQ_zR_m$ (I), wherein M is a metal, Q is a halogen selected from Cl, Br, F or I, z is from 1 to 6, R is selected from alkyl, CO, cyclopentadienyl, amidinate, diazadiene, or amidate, and m is from 0 to 6; and exposing at least a portion of the substrate 102 to an organosilane reducing agent comprising a compound of general formula (II) or general formula (III)

(II)

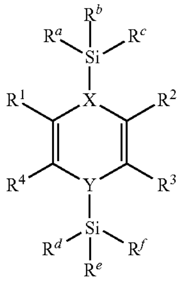

(III)

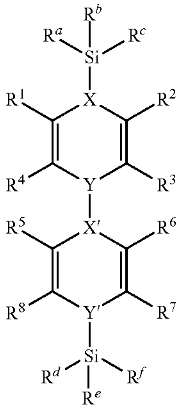

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C), to deposit a metal film as a work function layer 108 on the substrate 102, the metal film substantially free of carbon.

In some embodiments, exposing the substrate surface to the halide precursor and the organosilane reactant occurs sequentially. For example, an ALD type process so that the substrate surface (or portion thereof) is exposed to the halide precursor and the organosilane reactant sequentially or substantially sequentially. In some embodiments, exposing the substrate surface to the halide precursor and the organosilane reactant occurs simultaneously. For example, a chemical vapor deposition (CVD) type process in which both the halide precursor and the organosilane reactant are flowed into the processing chamber at the same time, allowing gas phase reactions of the precursor and the reactant.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "some embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in some embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a metal film, the method comprising:

exposing at least a portion of a substrate to a first halide precursor comprising a compound having general Formula (I)

$$MQ_zR_m, \qquad (I)$$

wherein M is a metal, Q is a halogen selected from CI, Br, F or I, z is from 1 to 6, R is selected from alkyl, CO, cyclopentadienyl, amidinate, diazadiene, or amidate, and m is from 0 to 6, exposing at least a portion of the substrate to an organosilane reactant comprising a compound of general Formula (II) or general Formula (III):

(II)

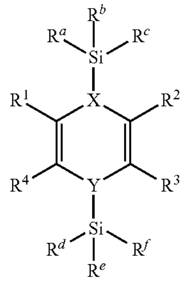

(III)

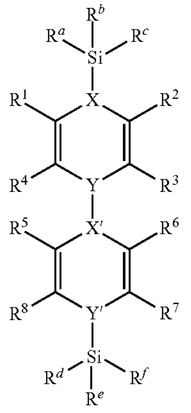

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C);

exposing at least a portion of the substrate to a second halide precursor comprising the compound having the general Formula (I), wherein M of each of the first halide precursor and the second halide precursor is independently selected from one or more of scandium (Sc), yttrium (Y), lanthanum (La), actinium (Ac), zirconium (Zr), vanadium (V), chromium (Cr), manganese (Mn), rhenium (Re), ruthenium (Ru), osmium (Os), cobalt (Co), rhodium (Rh), iridium (Ir), nickel (Ni), palladium (Pd), platinum (Pt), copper (Cu), silver (Ag), gold (Au), cerium (Ce), or zinc (Zn), and the first halide precursor is different from the second halide precursor; and exposing at least a portion of the substrate to the organosilane reactant comprising the compound of general Formula (II) or general Formula (III), to deposit the metal film on the substrate, the metal film substantially free of carbon.

2. The method of claim 1, wherein M of each of the first halide precursor and the second halide precursor is independently selected from one or more of zirconium (Zr), lanthanum (La), zinc (Zn), chromium (Cr), or vanadium (V).

3. The method of claim 1, wherein Q of each of the first halide precursor and the second halide precursor is independently Cl or Br.

4. The method of claim 1, wherein M of each of the first halide precursor and the second halide precursor is independently selected from one or more of scandium (Sc), yttrium (Y), lanthanum (La), zirconium (Zr), chromium (Cr), manganese (Mn), rhenium (Re), ruthenium (Ru), osmium (Os), cobalt (Co), rhodium (Rh), iridium (Ir), nickel (Ni), palladium (Pd), platinum (Pt), copper (Cu), or zinc (Zn).

5. The method of claim 1, wherein at least one of $R^a$, $R^b$, $R^c$, $R^d$, $R^e$, and $R^f$ of each of the first halide precursor and the second halide precursor independently comprises methyl.

6. The method of claim 1, wherein exposing the substrate to the first halide precursor, the organosilane reactant, and the second halide precursor occurs sequentially.

7. The method of claim 1, wherein exposing the substrate to the first halide precursor, the organosilane reactant, and the second halide precursor occurs simultaneously.

8. The method of claim 1, wherein the organosilane reactant is selected from one or more bis(trimethylsilyl) cyclohexadiene, bis(trimethylsilyl)diaza-cyclohexadiene, bis(trimethylsilyl)-aza-cyclohexadiene, bis(trimethylsilyl)-dihydro-bipyridine, 3,6-bis(trimethylsilyl)-1,4-cyclohexadiene, 1-methyl-3,6-bis(trimethylsilyl)-1,4-cyclohexadiene, and 1,4-bis-(trimethylsilyl)-1,4-diaza-2,5-cyclohexadiene.

9. The method of claim 1, wherein the substrate is in a processing chamber.

10. The method of claim 9, further comprising purging the processing chamber of the first halide precursor prior to exposing the substrate to the organosilane reactant.

11. The method of claim 10, further comprising purging the processing chamber of the organosilane reactant.

12. The method of claim 10, wherein purging the processing chamber comprises flowing a purge gas into the processing chamber, the purge gas selected from one or more of nitrogen ($N_2$), helium (He), and argon (Ar).

13. A method of depositing a metal film, the method comprising:

exposing at least a portion of a substrate surface to a first halide precursor comprising a compound having general Formula (I)

$$MQ_zR_m, \qquad (I)$$

wherein M is a metal selected from one or more of zirconium (Zr), lanthanum (La), cerium (Ce), zinc (Zn), chromium (Cr), or vanadium (V), Q is a halogen selected from CI, Br, F or I, z is from 1 to 6, R is selected from alkyl, CO, cyclopentadienyl, amidinate, diazadiene, or amidate, and m is from 0 to 6, exposing at least a portion of the substrate surface to an organosilane reactant comprising a compound of general Formula (II) or general Formula (III):

(II)

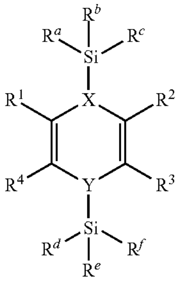

(III)

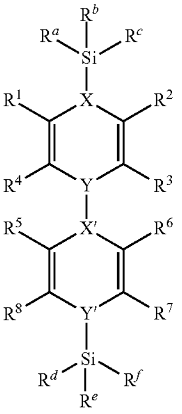

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C);

exposing at least a portion of the substrate surface to a second halide precursor comprising the compound having the general Formula (I), wherein M is a metal selected from one or more of zirconium (Zr), lanthanum (La), cerium (Ce), zinc (Zn), chromium (Cr), or vanadium (V), and the first halide precursor is different from the second halide precursor; and expose at least a portion of the substrate surface to the organosilane reactant comprising the compound of general Formula (II) or general Formula (III), to deposit the metal film on the substrate surface, the metal film substantially free of carbon.

14. The method of claim 13, wherein M of the first halide precursor is selected from one or more of zirconium (Zr), lanthanum (La), zinc (Zn), or chromium (Cr).

15. A method of depositing a metal film, the method comprising:

exposing at least a portion of a substrate to a first halide precursor comprising a compound having general Formula (I)

$$MQ_zR_m \quad (I),$$

wherein M is a metal independently selected from one or more of scandium (Sc), yttrium (Y), lanthanum (La), actinium (Ac), zirconium (Zr), vanadium (V), chromium (Cr), manganese (Mn), rhenium ($R^e$), ruthenium (Ru), osmium (Os), cobalt (Co), rhodium (Rh), iridium (Ir), nickel (Ni), palladium (Pd), platinum (Pt), copper (Cu), silver (Ag), gold (Au), or zinc (Zn), Q is a halogen selected from CI, Br, F or I, z is from 1 to 6, R is selected from alkyl, CO, cyclopentadienyl, amidinate, diazadiene, or amidate, and m is from 0 to 6, exposing at least a portion of the substrate to an organosilane reactant comprising a compound of general Formula (II) or general Formula (III):

(II)

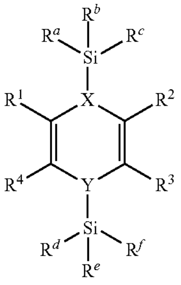

(III)

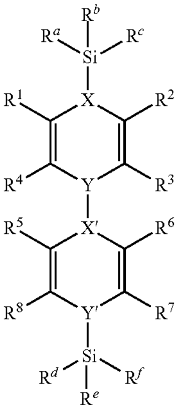

wherein $R^1$, $R^2$, $R^3$, $R^4$, $R^5$, $R^6$, $R^7$, $R^8$, $R^a$, $R^b$, $R^c$, $R^d$, $R^e$, and $R^f$ are independently selected from hydrogen (H), substituted alkyl or unsubstituted alkyl; and X, Y, X', and Y' are independently selected from nitrogen (N) and carbon (C);

exposing at least a portion of the substrate to a second halide precursor comprising the compound having the general Formula (I), wherein M of the second halide precursor is aluminum (AI); and exposing at least a portion of the substrate to the organosilane reactant comprising the compound of general Formula (II) or general Formula (III), to deposit the metal film on the substrate, the metal film comprising an alloy of the metal M from the first halide precursor and aluminum (AI), the metal film substantially free of carbon.

16. The method of claim 15, wherein M of the first halide precursor is selected from one or more of scandium (Sc), yttrium (Y), lanthanum (La), zirconium (Zr), rhenium (Re), ruthenium (Ru), osmium (Os), cobalt (Co), rhodium (Rh), iridium (Ir), palladium (Pd), platinum (Pt), copper (Cu), or zinc (Zn).

17. The method of claim 16, wherein M of the first halide precursor is selected from one or more of scandium (Sc), yttrium (Y), lanthanum (La), zirconium (Zr), rhenium (Re), ruthenium (Ru), copper (Cu), zinc (Zn), osmium (Os), cobalt (Co), or iridium (Ir).

* * * * *